United States Patent
Cheng et al.

(10) Patent No.: US 10,147,602 B2
(45) Date of Patent: *Dec. 4, 2018

(54) DOUBLE ASPECT RATIO TRAPPING

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/595,602

(22) Filed: May 15, 2017

(65) Prior Publication Data
US 2017/0250074 A1 Aug. 31, 2017

Related U.S. Application Data

(60) Continuation of application No. 15/162,164, filed on May 23, 2016, now Pat. No. 9,653,285, which is a
(Continued)

(51) Int. Cl.
*H01L 21/02* (2006.01)
*H01L 29/267* (2006.01)
(Continued)

(52) U.S. Cl.
CPC .... *H01L 21/02532* (2013.01); *H01L 21/0262* (2013.01); *H01L 21/02381* (2013.01);
(Continued)

(58) Field of Classification Search
CPC .......... H01L 29/7827; H01L 27/11582; H01L 29/66666; H01L 27/10876; H01L 29/66833
See application file for complete search history.

(56) References Cited

U.S. PATENT DOCUMENTS 8,034,697 B2   10/2011   Fiorenza et al.
8,274,097 B2   9/2012    Cheng
(Continued)

OTHER PUBLICATIONS

List of IBM Patents or Patent Applications Treated As Related dated May 15, 2017, 2 Pages.

*Primary Examiner* — Tony Tran
(74) *Attorney, Agent, or Firm* — Scully, Scott, Murphy & Presser, P.C.; Daniel P. Morris, Esq.

(57) ABSTRACT

A semiconductor structure is provided by a process in which two aspect ratio trapping processes are employed. The structure includes a semiconductor substrate portion of a first semiconductor material having a first lattice constant. A plurality of first semiconductor-containing pillar structures of a second semiconductor material having a second lattice constant that is greater than the first lattice constant extend upwards from a surface of the semiconductor substrate portion. A plurality of second semiconductor-containing pillar structures of a third semiconductor material having a third lattice constant that is greater than the first lattice constant extend upwards from another surface of the semiconductor substrate portion. A spacer separates each first semiconductor-containing pillar structure from each second semiconductor-containing pillar structure. Each second semiconductor-containing pillar structure has a width that is different from a width of each first semiconductor-containing pillar structure.

11 Claims, 5 Drawing Sheets

Related U.S. Application Data division of application No. 14/500,244, filed on Sep. 29, 2014, now Pat. No. 9,349,808.

(51) Int. Cl.

| | | |
|---|---|---|
| *H01L 21/302* | (2006.01) | |
| *H01L 21/311* | (2006.01) | |
| *H01L 29/06* | (2006.01) | |
| *H01L 29/165* | (2006.01) | |
| *H01L 21/762* | (2006.01) | |
| *H01L 29/04* | (2006.01) | |
| *H01L 21/308* | (2006.01) | |
| *H01L 21/8258* | (2006.01) | |

(52) U.S. Cl.
CPC .. *H01L 21/02433* (2013.01); *H01L 21/02538* (2013.01); *H01L 21/02551* (2013.01); *H01L 21/02639* (2013.01); *H01L 21/302* (2013.01); *H01L 21/3086* (2013.01); *H01L 21/31111* (2013.01); *H01L 21/762* (2013.01); *H01L 29/045* (2013.01); *H01L 29/0649* (2013.01); *H01L 29/0692* (2013.01); *H01L 29/165* (2013.01); *H01L 29/267* (2013.01); *H01L 21/8258* (2013.01)

(56) References Cited

U.S. PATENT DOCUMENTS

| | | |
|---|---|---|
| 8,384,196 B2 | 2/2013 | Cheng et al. |
| 8,481,341 B2 | 7/2013 | Clark |
| 8,557,666 B2 * | 10/2013 | Wei .................. H01L 21/76224 257/E21.09 |
| 8,628,989 B2 | 1/2014 | Lochtefeld |
| 8,629,047 B2 | 1/2014 | Cheng et al. |
| 2010/0105210 A1 | 4/2010 | Chen et al. |
| 2010/0167502 A1 | 7/2010 | Yen |
| 2010/0216277 A1 | 8/2010 | Fiorenza et al. |
| 2011/0049568 A1 | 3/2011 | Lochtefeld et al. |
| 2012/0256272 A1 * | 6/2012 | Jeungling ......... H01L 21/76224 257/E21.09 |
| 2013/0115721 A1 | 5/2013 | Clark |
| 2016/0043190 A1 | 2/2016 | Banghart |

* cited by examiner

DOUBLE ASPECT RATIO TRAPPING

BACKGROUND

The present application relates to a semiconductor structure and a method of forming the same. More particularly, the present application relates to a method of providing a semiconductor structure including a first array of semiconductor-containing pillar structures and a second array of semiconductor-containing pillar structures both of which extend upwards from a semiconductor substrate, wherein the various semiconductor-containing pillar structures have a higher lattice constant than the semiconductor substrate.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

III-V compound semiconductor field effect transistors are considered a high performance option for future technology nodes. Co-integration of III-V semiconductor compounds with silicon is very challenging due to the high lattice mismatch between the III-V semiconductor compound and silicon. Such a challenge is not limited to the integration of III-V compound semiconductor with silicon, but also exists when integrating semiconductor materials having different lattice constants. Thus, a technique is needed to integrate semiconductor materials having different lattice constants.

SUMMARY

A semiconductor structure is provided by a process in which two aspect ratio trapping processes are employed. The structure includes a semiconductor substrate portion of a first semiconductor material having a first lattice constant. A plurality of first semiconductor-containing pillar structures of a second semiconductor material having a second lattice constant that is greater than the first lattice constant extend upwards from a surface of the semiconductor substrate portion. A plurality of second semiconductor-containing pillar structures of a third semiconductor material having a third lattice constant that is greater than the first lattice constant extend upwards from another surface of the semiconductor substrate portion. A spacer separates each first semiconductor-containing pillar structure from each second semiconductor-containing pillar structure. Each second semiconductor-containing pillar structure has a width that is different from a width of each first semiconductor-containing pillar structure.

In one aspect of the present application, a method of forming a semiconductor structure is provided. In one embodiment of the present application, the method includes providing a semiconductor substrate comprising a first semiconductor material of a first lattice constant and containing a plurality of sacrificial trench isolation structures therein. Next, a plurality of first semiconductor-containing pillar structures comprising a second semiconductor material having a second lattice constant that is greater than the first lattice constant is formed adjacent each sacrificial trench isolation structure and extend upwards from a first sub-surface of the semiconductor substrate. A dielectric cap portion is thereafter formed on a topmost surface of each first semiconductor-containing pillar structure, wherein a topmost surface of each dielectric cap portion is coplanar with a topmost surface of each sacrificial trench isolation structure of the plurality of sacrificial trench isolation structures. Each sacrificial trench isolation structure is then removed to expose a second sub-surface of the semiconductor substrate. A dielectric spacer is then formed along sidewall surfaces of each first semiconductor-containing pillar structure and on a portion of the second sub-surface of the semiconductor substrate. A plurality of second semiconductor-containing pillar structures comprising a third semiconductor material having a third lattice constant that is greater than the first lattice constant is formed adjacent the dielectric spacer and on another portion of the second sub-surface of the semiconductor substrate. In accordance with the present application, each second semiconductor-containing pillar structure has a width that is different from a width of each first semiconductor-containing pillar structure.

In another aspect of the present application, a semiconductor structure is provided. In accordance with an embodiment of the present application, the semiconductor structure includes a semiconductor substrate portion comprising a first semiconductor material having a first lattice constant. A plurality of first semiconductor-containing pillar structures comprising a second semiconductor material having a second lattice constant that is greater than the first lattice constant extend upwards from a surface of the semiconductor substrate portion. A plurality of second semiconductor-containing pillar structures comprising a third semiconductor material having a third lattice constant that is greater than the first lattice constant extend upwards from another surface of the semiconductor substrate portion. A dielectric spacer is laterally separating each first semiconductor-containing pillar structure from each second semiconductor-containing pillar structure, wherein the second semiconductor-containing pillar structure has a width that is different from a width of each first semiconductor-containing pillar structure.

DESCRIPTION

Figure 1:
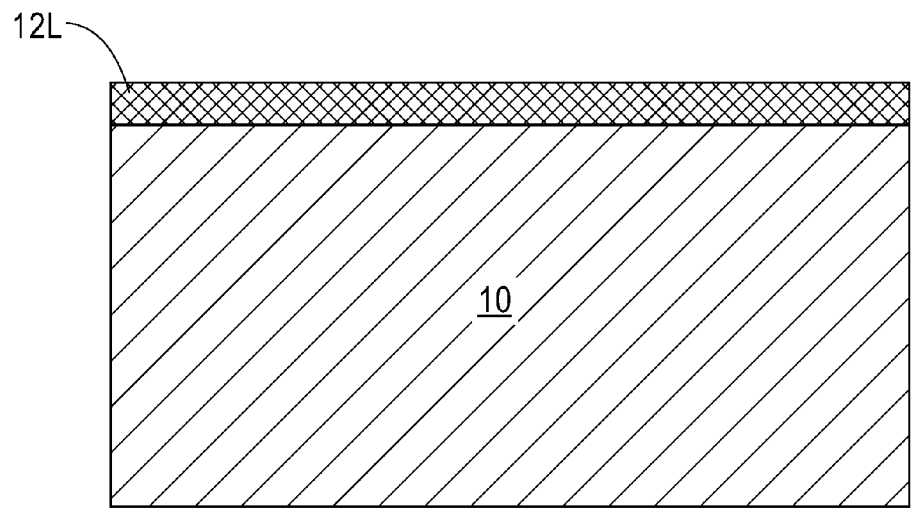
FIG. 1 is a cross sectional view of an exemplary semiconductor structure comprising a hard mask layer located on an exposed topmost surface of a semiconductor substrate comprising a first semiconductor material having a first lattice constant that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

As mentioned above, co-integration of semiconductor materials having different lattice constants is one challenging aspect of forming high performance devices of future technology nodes. Aspect ratio trapping (ART) is one way to overcome the lattice mismatch. In ART, the aspect ratio trapping typically works better when the aspect ratio (trench depth to trench width) of the trench is at least 1:2. However, ART requires trenches with dielectric sidewalls to epitaxial grow a lattice mismatched semiconductor material from a base semiconductor substrate. The dielectric regions that are used during ART consume area, which is contrary to the shrinking requirements of future smaller device nodes. The present application provides a method that overcomes the above problems with conventional ART.

Referring first to FIG. 1, there is illustrated an exemplary semiconductor structure comprising a hard mask layer 12L located on an exposed topmost surface of a semiconductor substrate 10 that can be employed in accordance with an embodiment of the present application. The semiconductor substrate 10 that can be employed in the present application is a bulk semiconductor substrate that comprises a first semiconductor material having a first lattice constant.

The term "bulk" as used in conjunction with the phrase "semiconductor substrate" denotes that the semiconductor substrate 10 is comprised entirely of the first semiconductor material. The first semiconductor material the provides the semiconductor substrate 10 may include but is not limited to, Si, Ge, SiGe, SiC, SiGeC, and III/V compound semiconductors such as, for example, InAs, GaAs, and InP. The semiconductor substrate 10 may be a single crystalline semiconductor material, a polycrystalline semiconductor material or an amorphous semiconductor material. In one embodiment of the present application, the semiconductor substrate 10 is comprised of single crystalline silicon. The crystal orientation of the semiconductor substrate 10 may be {100}, {110}, or {111}. Other crystallographic orientations besides those specifically mentioned can also be used in the present application.

The hard mask layer 12L that is present on the exposed topmost surface of the semiconductor substrate 10 is a contiguous layer that covers the entirety of the topmost surface of the semiconductor substrate 10. The hard mask layer 12L that is employed in the present application may include a semiconductor oxide, a semiconductor nitride and/or a semiconductor oxynitride. In one embodiment, the hard mask material that can be used in providing the hard mask layer 12L can be comprised of silicon dioxide. In another embodiment, the hard mask material that can be used in providing the hard mask layer 12L can be comprised of silicon nitride. In yet another embodiment, the hard mask material that can be used in providing the hard mask layer 12L can be a stack comprised of, in any order, silicon dioxide and silicon nitride.

In some embodiments, the hard mask material that can be used in providing the hard mask layer 12L can be formed by a deposition process such as, for example, chemical vapor deposition (CVD) or plasma enhanced chemical vapor deposition (PECVD). In other embodiments, the hard mask material that can be used in providing the hard mask layer 12L can be formed by a thermal process such as, for example, thermal oxidation and/or thermal nitridation. In yet other embodiments, the hard mask material that can be used in providing the hard mask layer 12L can be formed by a combination of a deposition process and a thermal process. The thickness of the hard mask material that can be used in providing the hard mask layer 12L can range from 2 nm to 10 nm, with a thickness from 3 nm to 6 nm being more typical.

Figure 2:
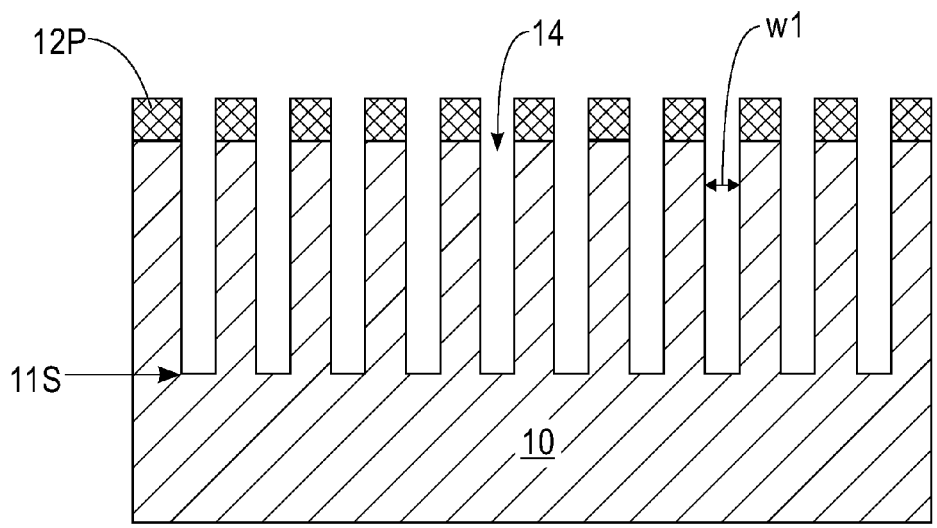
FIG. 2 is a cross sectional view of the exemplary semiconductor structure of FIG. 1 after patterning the hard mask layer and the semiconductor substrate to provide a plurality of first trenches located within the semiconductor substrate.

Referring now to FIG. 2, there is illustrated the exemplary semiconductor structure of FIG. 1 after patterning the hard mask layer 12L and the semiconductor substrate 10 to provide a plurality of first trenches 14 located within the semiconductor substrate 10. The remaining portions of the hard mask layer 12L can now be referred herein as a hard mask portion 12P.

The plurality of first trenches 14 can be formed by patterning the hard mask layer 12L and the semiconductor substrate 10. Each first trench of the plurality of first trenches 14 that is formed extends completely through the hard mask layer 12L but only partially into the semiconductor substrate 10. Thus, a bottommost surface of each first trench of the plurality of first trenches 14 exposes a sub-surface 11S of the semiconductor substrate. By "sub-surface" it is meant a surface of the original semiconductor substrate 10 that is located beneath the topmost surface of the semiconductor substrate 10. In one embodiment of the present application, the sub-surface 11S of the semiconductor substrate 10 that is exposed in this step of the present application is located from 20 nm to 80 nm below the original topmost surface of the semiconductor substrate 10. In one embodiment of the present application, the width, i.e., first width w1, of each first trench 14, as measured from one exposed sidewall surface of the semiconductor substrate 10 to a neighboring sidewall surface of the semiconductor substrate 10 is from 50 nm to 1 mirometer.

As stated above, the plurality of first trenches 14 can be defined by a patterning process. In one embodiment, the patterning process may include lithography and etching. In another embodiment, the patterning process includes a sidewall image transfer (SIT) process. The SIT process includes forming a contiguous mandrel material layer (not shown) on the topmost surface of the hard mask layer 12L. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the surface of the hard mask layer 12L.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. Since the dielectric spacers are used in the SIT process as an etch mask, the width of the each dielectric spacer determines the width of each first trench 14.

After formation of the dielectric spacers, the SIT process continues by removing each mandrel structure. Each mandrel structure can be removed by an etching process that is selective for removing the mandrel material as compared to the material of the dielectric spacers and hard mask layer 12L. Following the mandrel structure removal, the SIT process continues by transferring the pattern provided by the dielectric spacers into the hard mask layer 12L and then into the semiconductor substrate 10. The pattern transfer may be achieved by an etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

Figure 3:
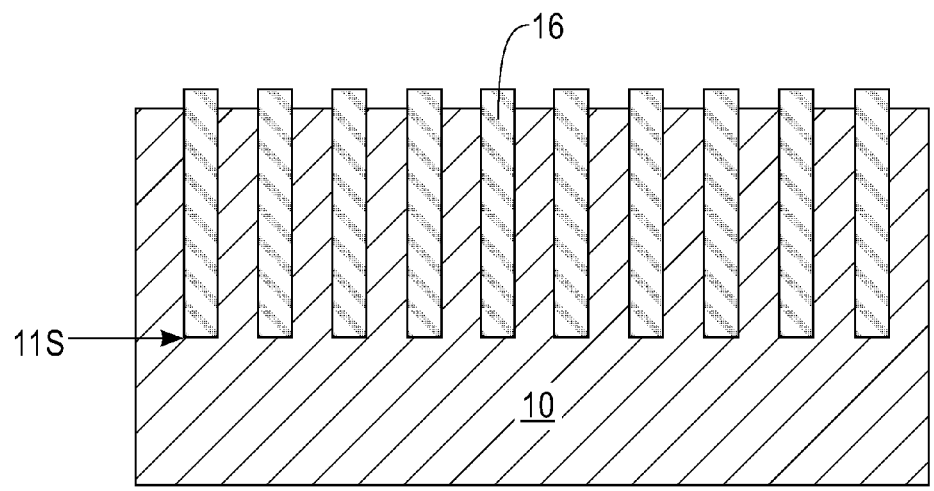
FIG. 3 is a cross sectional view of the exemplary semiconductor structure of FIG. 2 after providing a plurality of sacrificial trench isolation structures by filling each first trench of the plurality of first trenches with a trench dielectric material.

Referring now to FIG. 3, there is illustrated the exemplary semiconductor structure of FIG. 2 after providing a plurality of sacrificial trench isolation structure 16 by filling each first trench of the plurality of first trenches 14 with a trench dielectric material, and subsequent removal of each hard mask portion. The trench dielectric material that fills each first trench of the plurality of first trenches 14 and provides each sacrificial trench isolation structure 16 comprises a different dielectric material than the dielectric material forming an uppermost portion of the hard mask layer 12L. In one example, and when the topmost surface of the hard mask layer 12L comprises silicon dioxide, then the trench dielectric material may comprise silicon nitride. In another example, and when the topmost surface of the hard mask layer 12L comprises silicon nitride, then the trench dielectric material may comprise silicon dioxide.

The filling of the trench dielectric material may comprise a deposition process, followed by a planarization process. Examples of deposition processes than can be used to provide the trench dielectric material within each first trench of the plurality of first trenches 14 include chemical vapor deposition, plasma enhanced chemical vapor deposition, or physical vapor deposition. The trench dielectric material that is provided in each first trench of the plurality of first trenches 14 typically overfills each first trench. Thus, a planarization process such as, for example, chemical mechanical planarization, can be used to provide sacrificial trench isolation structures 16 that are coplanar with the topmost surface of each hard mask portion 12P; this aspect of the present application is not shown in FIG. 3.

Each hard mask portion 12P is then removed utilizing an etching process that selectively removes the hard mask material that provides each hard mask portion 12P as compared to the trench dielectric material that provides each sacrificial trench isolation structure of the plurality of sacrificial trench isolation structures 16. After the removal of each hard mask portion 12P, a topmost surface of the semiconductor substrate 10, which is located between each sacrificial trench isolation structure of the plurality of sacrificial trench isolation structures 16, is exposed. As is shown in FIG. 3, the topmost surface of each sacrificial trench isolation structure of the plurality of sacrificial trench isolation structures 16 is laterally offset and located above the topmost surface of the semiconductor substrate 10 which is located between each sacrificial trench isolation structure of the plurality of sacrificial trench isolation structures 16.

Figure 4:
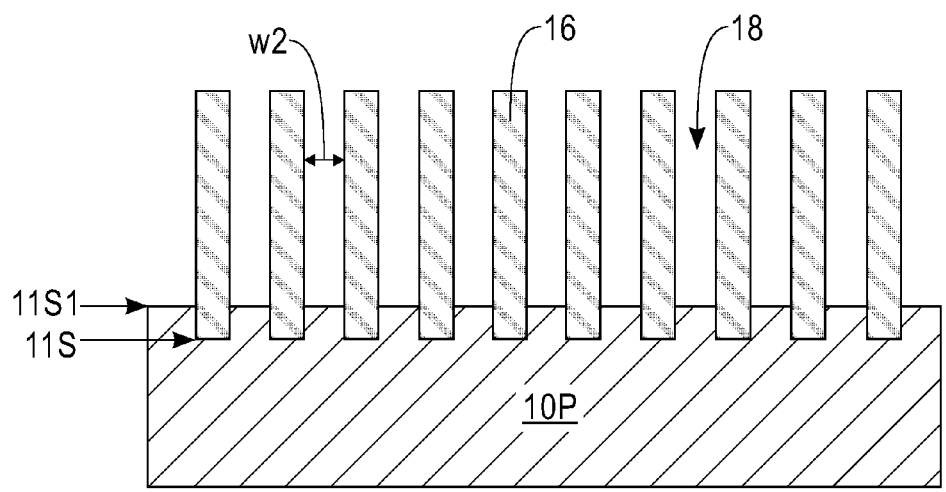
FIG. 4 is a cross sectional view of the exemplary semiconductor structure of FIG. 3 after forming a plurality of second trenches in the semiconductor substrate and adjacent each sacrificial trench isolation structure.

Referring now to FIG. 4, there is illustrated the exemplary semiconductor structure of FIG. 3 after forming a plurality of second trenches 18 in the semiconductor substrate 10 and adjacent each sacrificial trench isolation structure of the plurality of sacrificial trench isolation structures 16.

In one embodiment of the present application, each second trench of the plurality of second trenches 18 can be formed by recessing of the exposed portions of the semiconductor substrate 10 that is located adjacent each sacrificial trench isolation structure of the plurality of sacrificial trench isolation structures 16. In one example, the recessing of the exposed portions of the semiconductor substrate 10 can be performed utilizing an etching process that is selective in removing semiconductor material as compared to the trench dielectric material that provides each sacrificial trench isolation structure of the plurality of sacrificial trench isolation structures 16. In one embodiment of the present application, the etch employed to recess the exposed portion of the semiconductor substrate 10 can be performed utilizing an anisotropic etching process. In one example, the anisotropic etch may include reactive ion etching (RIE).

Each second trench of the plurality of second trenches 18 exposes another sub-surface 11S1 of the semiconductor substrate 10. The another sub-surface 11S1 of the semiconductor substrate 10 that is exposed is vertically offset and located above sub-surface 11S that was previously exposed when the plurality of first trenches 14 were formed into the semiconductor substrate 10. Thus, and as shown in FIG. 4, the another sub-surface 11S1 is located above a bottommost surface of each sacrificial trench isolation structure of the plurality of sacrificial trench isolation structures 16. As such, a lower portion of each sacrificial trench isolation structure of the plurality of sacrificial trench isolation structure 16 is embedded with a remaining portion of the semiconductor substrate 10. The remaining portion of the semiconductor substrate 10 may be referred to herein as a semiconductor substrate portion 10P. In one embodiment of the present application, the width, i.e., second width w2, of each second trench 18, as measured from one exposed sidewall surface of a sacrificial trench isolation structure 16 to a neighboring sidewall surface of a sacrificial trench isolation structure 16 is greater than the first width. In one embodiment of the present application, the second width is from 10 nm to 1 micrometer.

Figure 5:
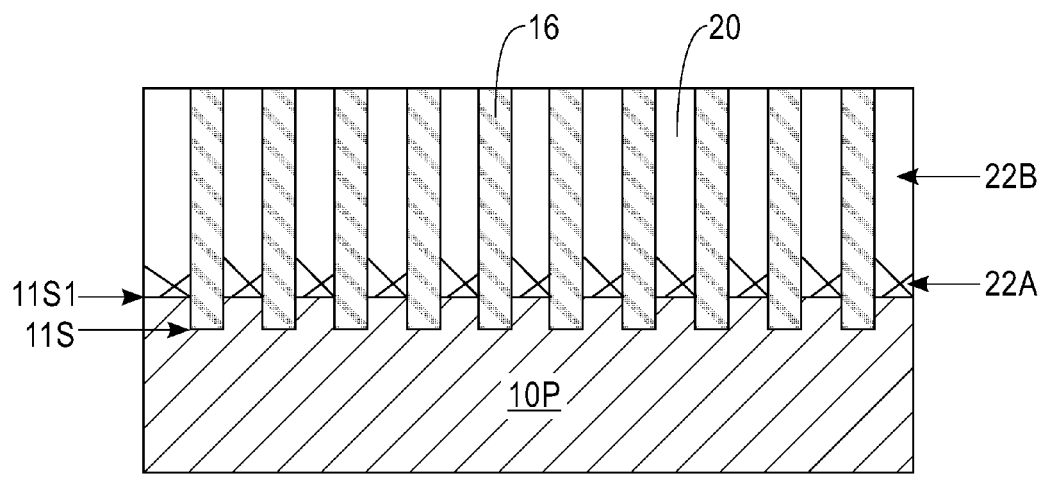
FIG. 5 is a cross sectional view of the exemplary semiconductor structure of FIG. 4 after forming a plurality of first

Referring now to FIG. 5, there is illustrated the exemplary semiconductor structure of FIG. 4 after forming a plurality of first semiconductor-containing pillar structures 20 comprising a second semiconductor material having a second lattice constant that is greater than the first lattice constant in each second trench of the plurality of second trenches 18. In one example of the present application and when the semiconductor substrate 10 comprises silicon, then the second semiconductor material that provides each first semiconductor-containing pillar structure 20 may comprise germanium. In another example of the present application and when the semiconductor substrate 10 comprises silicon, then the second semiconductor material that provides each first semiconductor-containing pillar structure 20 may comprise an III-V compound semiconductor material such as, for example, InGaAs, InP, InAs and GaAs. In yet a further example of the present application and when the semiconductor substrate 10 comprises silicon, then the second semiconductor material that provides each first semiconductor-containing pillar structure 20 may comprise an II-VI compound semiconductor.

Since the first semiconductor-containing pillar structures 20 are formed within the second trenches 18, each first semiconductor-containing pillar structure of the plurality of first semiconductor-containing pillar structures 20 has width that is equal to the width, i.e., w2, of the second trenches 18. The second semiconductor material that provides each first semiconductor-containing pillar structure 20 has a bottommost surface that directly contacts the another sub-surface 11S1 of the semiconductor substrate portion 10P, and a topmost surface that is coplanar with a topmost surface of each sacrificial trench isolation structure of the plurality of sacrificial trench isolation structures 16. As is shown, a sidewall surface of each first semiconductor-containing pillar structure of the plurality of first semiconductor-containing pillar structures 20 directly contacts a sidewall surface of neighboring sacrificial trench isolation structures 16.

The second semiconductor material that provides each first semiconductor-containing pillar structure 20 includes a lower portion 22A (indicated by "χ" in the drawings) having a first defect density and an upper portion 22B (not including the "χ") having a second defect density that is less than the first defect density.

The second semiconductor material that provides each first semiconductor-containing pillar structure 20 can be formed utilizing an epitaxial semiconductor regrowth process such as is described, for example, in U.S. Patent Application Publication No. 2011/0049568 to Lochtefeld et al., the entire content and disclosure of which is incorporated herein by reference. This epitaxial semiconductor regrowth may be referred to herein as an aspect ratio trapping process. In the present application, the aspect ratio trapping process typically works better when the aspect ratio (trench depth to trench width) of the trench is at least 1:2. Notably, and since an epitaxial semiconductor regrowth process is used in forming the second semiconductor material that provides each first semiconductor-containing pillar structure 20, each first semiconductor-containing pillar structure 20 has a same crystalline characteristic as the semiconductor material of the another sub-surface 11S1 of the semiconductor substrate portion 10P.

In some embodiments of the present application, the selected crystallographic direction of the second semiconductor material that provides each first semiconductor-containing pillar structure 20 is aligned with at least one propagation direction of threading dislocations in the opening in which each first semiconductor-containing pillar structure 20 is formed. Threading dislocations in this region may substantially terminate at the sidewall of the neighboring sacrificial trench isolation structures 16. In one embodiment of the present application, the selected crystallographic direction of the another sub-surface 11S1 of the semiconductor substrate portion 10P is aligned with direction of propagation of threading dislocations in the second semiconductor material that provides each first semiconductor-containing pillar structure 20. In certain embodiments, the orientation angle ranges from about 30 to about 60 degrees, for example, is about 45 degrees to such crystallographic direction. The surface of the another sub-surface 11S1 of the semiconductor substrate portion 10P may have a (100), (110), or (111) crystallographic orientation. In some embodiments, the selected crystallographic direction is substantially aligned with a <110> crystallographic direction of the another sub-surface 11S1 of the semiconductor substrate portion 10P.

The second semiconductor material that provides each first semiconductor-containing pillar structure 20 can be formed by selective epitaxial growth in any suitable epitaxial deposition system, including, but not limited to, atmospheric-pressure CVD (APCVD), low- (or reduced-) pressure CVD (LPCVD), ultra-high-vacuum CVD (UHVCVD), by molecular beam epitaxy (MBE), metal-organic CVD (MOCVD) or by atomic layer deposition (ALD). In the CVD process, selective epitaxial growth typically includes introducing a source gas into the chamber. The source gas may include at least one precursor gas and a carrier gas, such as, for example hydrogen. The type of precursor gas is dependent on the type of second semiconductor material that is used in providing each first semiconductor-containing pillar structure 20. Such precursor gases are well known to those skilled in the art and thus a detailed description of the same is not provided in this application. The reactor chamber is heated, such as, for example, by RF-heating. The growth temperature in the chamber may range from 250° C. to 900° C. The growth system also may utilize low-energy plasma to enhance the layer growth kinetics. The epitaxial growth system may be a single-wafer or multiple-wafer batch reactor.

In some embodiments of the present application, a planarization process such as, for example, chemical mechanical planarization, follows the epitaxial deposition of the second semiconductor material that provides each first semiconductor-containing pillar structure 20. In such embodiments, the topmost surface of each sacrificial trench isolation structure 16 serves as a planarization stop layer. The planarization process ensures that the topmost surface of each first semiconductor-containing pillar structure of the plurality of first semiconductor-containing pillar structures 20 is coplanar with a topmost surface of each sacrificial trench isolation structure 16.

Figure 6:
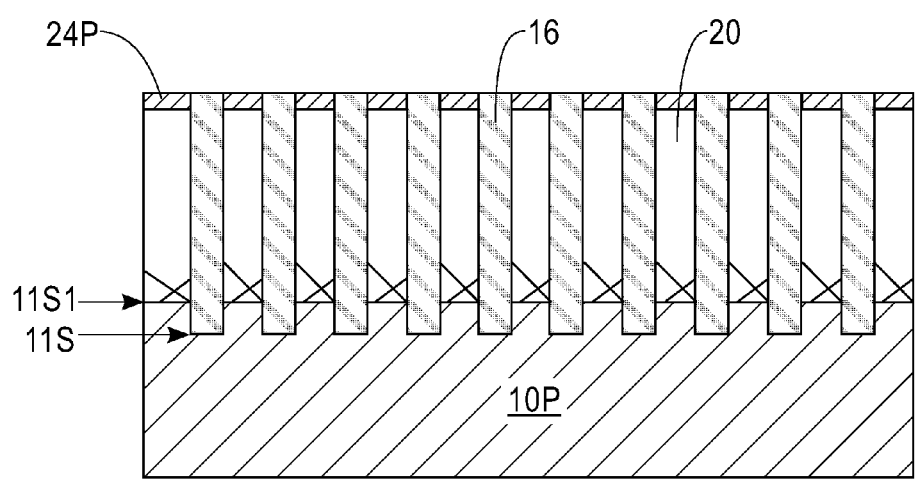
FIG. 6 is a cross sectional view of the exemplary semiconductor structure of FIG. 5 after forming a dielectric cap portion on an exposed topmost surface of each first semiconductor-containing pillar structure, wherein a topmost surface of each dielectric cap portion is coplanar with a topmost surface of each sacrificial trench isolation structure.

Referring now to FIG. 6, there is illustrated the exemplary semiconductor structure of FIG. 5 after forming a dielectric cap portion 24P on an exposed topmost surface of each first semiconductor-containing pillar structure 20, wherein a topmost surface of each dielectric cap portion 24P is coplanar with the topmost surface of each sacrificial trench isolation structure 16.

Each dielectric cap portion 24P is formed by first recessing the upper portion 22B of each of the first semiconductor-containing pillar structures 20 to expose a sub-surface of each first semiconductor-containing pillar structure 20 that is below the original topmost surface of each first semiconductor-containing pillar structure 20. The depth of this recess may vary so long as the depth of the recess stops within the upper portion 22B of each first semiconductor-containing pillar structure 20 having the second defect density. In one example, this recess is to a depth of from 1 nm to 20 nm below the topmost surface of each sacrificial trench isolation structure 16. The recess used in providing the dielectric cap portion 24P can be performed utilizing an anisotropic etch such as, for example, reactive ion etching.

After recessing the upper portion 22B of each of the first semiconductor-containing pillar structures 20, a dielectric cap material is deposited directly on the exposed sub-surface of each first semiconductor-containing pillar structure 20. The dielectric cap material that can be used in providing the dielectric cap portion 24P may include one of the dielectric materials mentioned above in providing the hard mask layer 12L with the proviso that the dielectric material used in providing the dielectric cap portion 24P is different from the trench dielectric material that was used in providing each sacrificial trench isolation structure 16. The dielectric cap material that can be used in providing the dielectric cap portion 14P may be formed by one of the deposition processes mentioned above in providing the hard mask layer 12L. After deposition of the dielectric cap material, a planarization process such as, for example, chemical mechanical planarization, can be employed to provide dielectric cap portions 24P having a topmost surface that is coplanar with the topmost surface of each sacrificial trench isolation structure 16.

Figure 7:
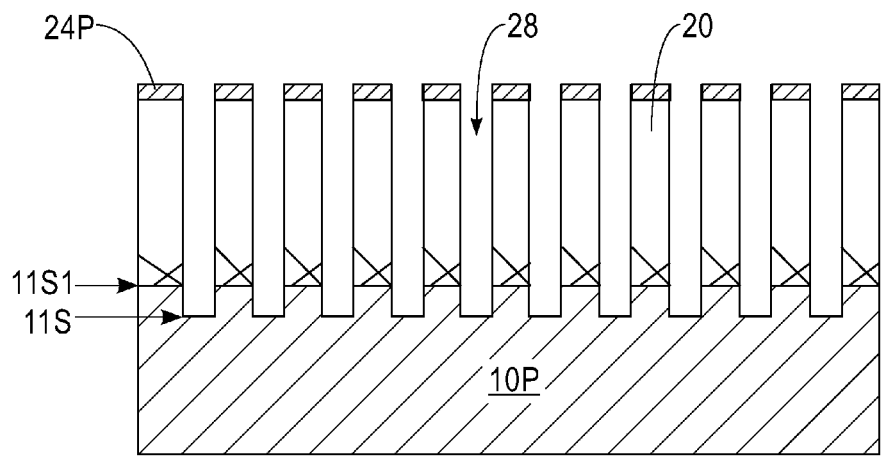
FIG. 7 is a cross sectional view of the exemplary semiconductor structure of FIG. 6 after removing each sacrificial trench isolation structure to provide a plurality of third trenches located adjacent each first semiconductor-containing pillar structure.

Referring now to FIG. 7, there is illustrated the exemplary semiconductor structure of FIG. 6 after removing each sacrificial trench isolation structure 16 to provide a plurality of third trenches 28 positioned adjacent each first semiconductor-containing pillar structure 20. At this point of the present application, each of third trenches 28 has a width and height that are equal to the width and height of each sacrificial trench isolation structure 16.

The removal of each sacrificial trench isolation structure 16 re-exposes sub-surface 11S of the original semiconductor substrate 10. The removal of each sacrificial trench isolation structure 16 also exposes sidewall surfaces of each first semiconductor-containing pillar structure 20 and sidewall surfaces of each dielectric cap portion 24P. The removal of each trench isolation structure 16 can be performed utilizing an anisotropic etching process that selectively removes the trench dielectric material relative to the dielectric material that provides each dielectric cap portion 24P.

Figure 8:
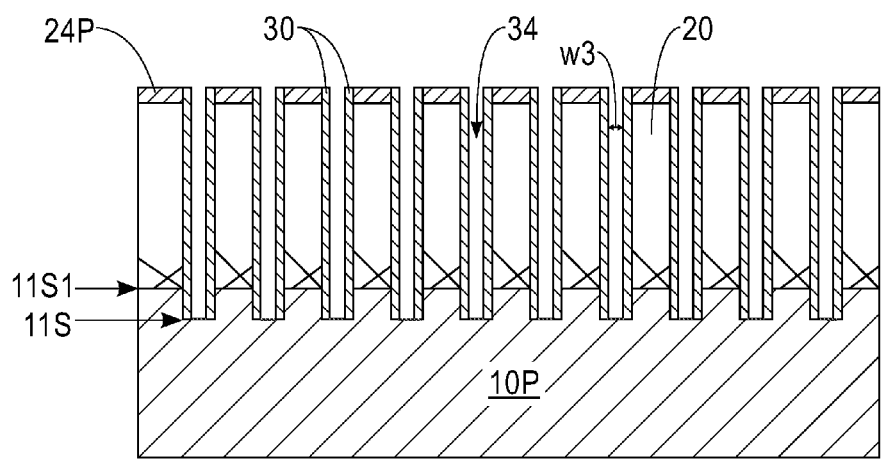
FIG. 8 is a cross sectional view of the exemplary semiconductor structure of FIG. 7 after forming a dielectric spacer on exposed sidewall surfaces of each first semiconductor-containing pillar structure and within each third trench of the plurality of third trenches.

Referring now to FIG. 8, there is illustrated the exemplary semiconductor structure of FIG. 7 after forming a dielectric spacer 30 on exposed sidewall surfaces of each first semiconductor-containing pillar structure 20 and within each third trench of the plurality of third trenches 28. In the present application, each third trench of the plurality of third trenches 28 includes two dielectric spacers 30.

Each dielectric spacer 30 has a bottommost surface that is located on a first portion of the sub-surface 11S of the semiconductor material portion 10P. As is shown, a topmost surface of each dielectric spacer 30 is coplanar with the topmost surface of each dielectric cap portion 24P. As is also shown, each dielectric spacer 30 has one sidewall surface that is directly contacts a sidewall surface of one of the first semiconductor-containing pillar structures 20 and a sidewall surface of one of the dielectric cap portions 24P.

Each dielectric spacer 30 comprises a dielectric spacer material including, for example, a dielectric oxide, dielectric nitride, and/or dielectric oxynitride. In one example, the dielectric spacer material used in providing each dielectric spacer 30 may be composed of silicon dioxide or silicon nitride. In one embodiment of the present application, the dielectric spacer material that provides each dielectric spacer 30 comprises a same material as the dielectric material that provides the dielectric cap portion 24P. In another embodiment of the present application, the dielectric spacer material that provides each dielectric spacer 30 comprises a different material as the dielectric material that provides the dielectric cap portion 24P. The dielectric spacer material that provides each dielectric spacer 30 can be provided by a deposition process including, for example, chemical vapor deposition (CVD), plasma enhanced chemical vapor deposition (PECVD), or physical vapor deposition (PVD). Following the deposition of the dielectric spacer material, an etch such as, for example, a reactive ion etch, can be used to provide the dielectric spacer 30.

The two dielectric spacers 30 that are present in each third trench of the plurality of third trenches 28 do not occupy the entire volume of the third trench 28. Instead, a gap 32 (gap 32 constituents a remaining portion of the third trench 28) is present between the two dielectric spacers 30 in each third trench of the plurality of third trenches 28. The gap 32 has a width, i.e., third width w3, that is less than the first width of the first trenches 14 mentioned above. The width of the gap 32 is also less than the second width of the second trenches 18.

Figure 9A:
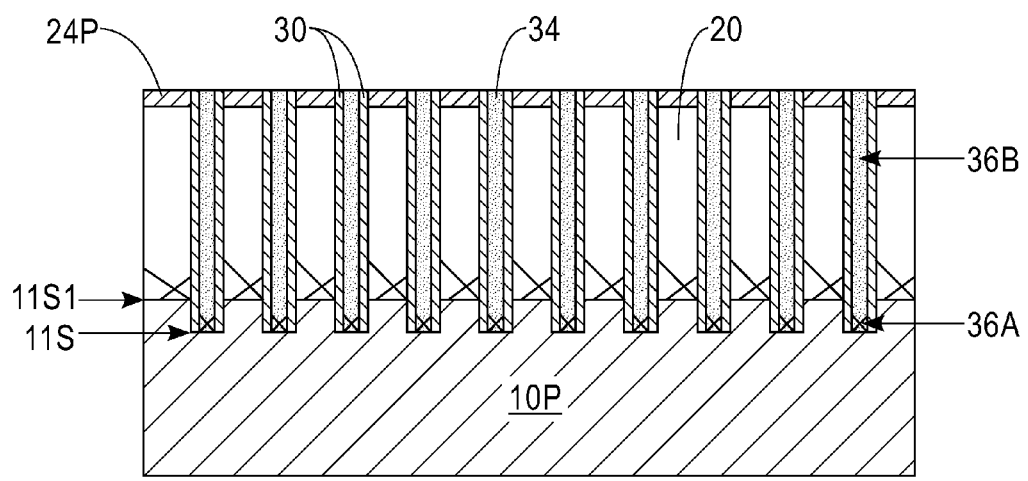
FIG. 9A is a cross sectional view of the exemplary semiconductor structure of FIG. 8 after forming a plurality of second semiconductor-containing pillar structures comprising a third semiconductor material having a third lattice constant that is greater than the first lattice constant in a remaining portion of each third trench of the plurality of third trenches.
Figure 9B:
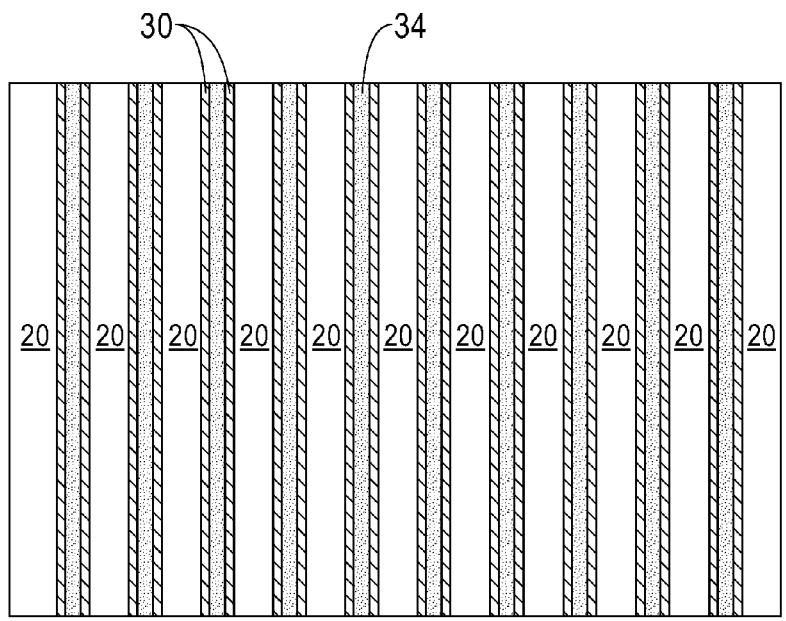
FIG. 9B is a top down view of the exemplary semiconductor structure shown in FIG. 9A.

Referring now to FIGS. 9A-9B, there are illustrated the exemplary semiconductor structure of FIG. 8 after forming a plurality of second semiconductor-containing pillar structures 34 comprising a third semiconductor material having a third lattice constant that is greater than the first lattice constant in each remaining portion of the third trench of the plurality of third trenches 28, i.e., in gap 32. In FIG. 9B, dielectric cap portion 24P is not shown so as to emphasize the position of the first semiconductor-containing pillar structure 20 relative to the second semiconductor pillar structure 34. In one embodiment of the present application, the third semiconductor material that provides each second semiconductor-containing pillar structure 34 comprises a same semiconductor material as the second semiconductor material that provides each first semiconductor-containing pillar structure 20. In another embodiment of the present application, the third semiconductor material that provides each second semiconductor-containing pillar structure 34 comprises a different semiconductor material than the second semiconductor material that provides each first semiconductor-containing pillar structure 20.

In one example of the present application and when the semiconductor substrate 10 comprises silicon, then the third semiconductor material that provides each second semiconductor-containing pillar structure 34 may comprise germanium. In another example of the present application and when the semiconductor substrate 10 comprises silicon, then the third semiconductor material that provides each second semiconductor-containing pillar structure 34 may comprise an III-V compound semiconductor material such as, for example, InGaAs, InP, InAs and GaAs. In yet a further example of the present application and when the semiconductor substrate 10 comprises silicon, then the third semiconductor material that provides each second semiconductor-containing pillar structure 34 may comprise an II-VI compound semiconductor.

Since the second semiconductor-containing pillar structures 34 are formed within gap 32, each second semiconductor-containing pillar structure of the plurality of second semiconductor-containing pillar structures 34 has width that is equal to the width, i.e., w3, of the gap 32. Thus, each of the second semiconductor-containing pillar structures 34 that is formed has a width that is less than the width of each of the first semiconductor-containing pillar structures 20.

The third semiconductor material that provides each second semiconductor-containing pillar structure 34 has a bottommost surface that directly contacts the sub-surface 11S of the semiconductor substrate portion 10P, and a topmost surface that is coplanar with a topmost surface of each dielectric spacer 30 and each dielectric cap portion 24P. As is shown, a sidewall surface of each second semiconductor-containing pillar structure of the plurality of second semiconductor-containing pillar structures 34 directly contacts a sidewall surface of a neighboring dielectric spacer 20. Thus, each second semiconductor-containing pillar structure 34 having the third width, w3, is vertically isolated from each first semiconductor-containing pillar structure 20 having the second width, w2, by a dielectric spacer 30. Each second semiconductor-containing pillar structure 34 has a height that greater than a height of each first semiconductor-containing pillar structure 20.

The third semiconductor material that provides each second semiconductor-containing pillar structure 34 includes a lower portion 36A (indicated by "χ" in the drawings) having a first defect density and an upper portion 36B (not including the "χ") having a second defect density that is less than the first defect density.

The third semiconductor material that provides each second semiconductor-containing pillar structure 34 can be formed utilizing an epitaxial semiconductor regrowth process such as described above in forming the second semiconductor material that provides each first semiconductor-containing pillar structure 20.

In some embodiments of the present application, a planarization process such as, for example, chemical mechanical planarization, follows the epitaxial deposition of the third semiconductor material that provides each second semiconductor-containing pillar structure 34. In such embodiments, the topmost surface of each dielectric cap portion 24P and a topmost surface of each dielectric spacer 30 serve as a dual planarization stop layer. The planarization process ensures that the topmost surface of each second semiconductor-containing pillar structure of the plurality of second semiconductor-containing pillar structures 34 is coplanar with the topmost surfaces of each dielectric cap portion 24P and each dielectric spacer 30.

FIGS. 9A-9B illustrate the semiconductor structure of the present application. The semiconductor structure that is shown in FIGS. 9A-9B includes a semiconductor substrate portion 10P comprising a first semiconductor material having a first lattice constant (in the top-down view shown in FIG. 9B element 24P is not shown for clarity). A plurality of first semiconductor-containing pillar structures 20 comprising a second semiconductor material having a second lattice constant that is greater than the first lattice constant extend upwards from a surface of the semiconductor substrate portion 10P. A plurality of second semiconductor-containing pillar structures 34 comprising a third semiconductor material having a third lattice constant that is greater than the first lattice constant extend upwards from another surface of the semiconductor substrate portion 10P. A dielectric spacer 30 is laterally separating each first semiconductor-containing pillar structure 20 from each second semiconductor-containing pillar structure 34. As is shown, each second semiconductor-containing pillar structure 34 has a width that is different from a width of each first semiconductor-containing pillar structure 20. Also, each of the second semiconductor-containing pillar structures 34 has a height that is greater than a height of each of the first semiconductor-containing pillar structures 20. A dielectric cap portion 24D is present on each of the first semiconductor-containing pillar structures 20 and has a topmost surface that is coplanar with a topmost surface of each of the second semiconductor-containing pillar structures 34.

The semiconductor structure shown in FIGS. 9A-9B can be used as a base substrate for use in forming various types of devices including, but not limited to, electronic devices, CMOS devices, and laser devices. The fabrication of such devices can be performed utilizing various techniques that are well known to those skilled in the art. In some embodiments, at least some of the dielectric cap portions 24P can be removed from atop some of the first semiconductor-containing pillar structures 20 prior to device fabrication.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a semiconductor substrate portion comprising a first semiconductor material having a first lattice constant;
   a plurality of first semiconductor-containing pillar structures composed entirely of a second semiconductor material having a second lattice constant that is greater than said first lattice constant and located directly on, and extending upwards from, a surface of said semiconductor substrate portion;
   a plurality of second semiconductor-containing pillar structures composed entirely of a third semiconductor material having a third lattice constant that is greater than said first lattice constant and located directly on, and extending upwards from, a sub-surface of said semiconductor substrate portion, wherein said second semiconductor material and said third semiconductor material each comprises a lower portion having a first defect density and an upper portion having a second defect density that is less than the first defect density; and a dielectric spacer laterally separating each first semiconductor-containing pillar structure from each second semiconductor-containing pillar structure and having a bottommost surface located directly on said sub-surface of said semiconductor substrate portion, wherein each of said second semiconductor-containing pillar structures has a width that is different from a width of each of said first semiconductor-containing pillar structures, and a topmost surface that is higher than a topmost surface of each first semiconductor-containing pillar structure, and wherein a bottommost surface of each second semiconductor-containing pillar structure is lower than a bottommost surface of each first semiconductor-containing pillar structure.

2. The semiconductor structure of claim 1, wherein said second semiconductor material and said third semiconductor material comprise a same semiconductor material.

3. The semiconductor structure of claim 1, wherein said second semiconductor material comprises a different semiconductor material than said third semiconductor material.

4. The semiconductor structure of claim 1, wherein each of said second semiconductor-containing pillar structures has a height that is greater than a height of each of said first semiconductor-containing pillar structures.

5. The semiconductor structure of claim 1, wherein said first semiconductor material is silicon and said second and third semiconductor materials are selected from germanium, an III-V compound semiconductor and an II-VI compound semiconductor.

6. The semiconductor structure of claim 1, wherein a lower portion of each second semiconductor-containing pillar structure is embedded within an upper portion of said semiconductor substrate portion.

7. The semiconductor structure of claim 1, wherein said second and third semiconductor material have an epitaxial relationship with said semiconductor substrate portion.

8. The semiconductor structure of claim 1, wherein said surface of said semiconductor substrate portion that contains each first semiconductor-containing pillar structure is raised relative to said another surface of said semiconductor portion that contains each second semiconductor-containing pillar structure.

9. The semiconductor structure of claim 1, wherein one of said second semiconductor-containing pillar structures is present between a nearest neighboring pair of first semiconductor-containing pillar structures.

10. A semiconductor structure comprising:
a semiconductor substrate portion comprising a first semiconductor material having a first lattice constant;
a plurality of alternating first semiconductor-containing pillar structures and second semiconductor-containing pillar structures, wherein each first semiconductor-containing pillar structure is composed entirely of a second semiconductor material having a second lattice constant that is greater than said first lattice constant and located directly on, and extending upwards from, a surface of said semiconductor substrate portion, and wherein each second semiconductor-containing pillar structure is composed of a third semiconductor material having a third lattice constant that is greater than said first lattice constant and located directly on, and extending upwards from, sub-surface of said semiconductor substrate portion, and wherein said second semiconductor material and said third semiconductor material each comprises a lower portion having a first defect density and an upper portion having a second defect density that is less than the first defect density; and
a dielectric spacer laterally separating each first semiconductor-containing pillar structure from each second semiconductor-containing pillar structure and having a bottommost surface located directly on said sub-surface of said semiconductor substrate portion, wherein each of said second semiconductor-containing pillar structures has a width that is different from a width of each of said first semiconductor-containing pillar structures, and a topmost surface that is higher than a topmost surface of each first semiconductor-containing pillar structure, and wherein a bottommost surface of each second semiconductor-containing pillar structure is lower than a bottommost surface of each first semiconductor-containing pillar structure.

11. The semiconductor structure of claim 10, wherein said surface of said semiconductor substrate portion that contains each first semiconductor-containing pillar structure is raised relative to said another surface of said semiconductor portion that contains each second semiconductor-containing pillar structure.

* * * * *